(12) United States Patent
Veitch et al.

(10) Patent No.: US 8,378,475 B1
(45) Date of Patent: Feb. 19, 2013

(54) OPTOELECTRONIC CHIP CARRIERS

(75) Inventors: Randall C. Veitch, Nazareth, PA (US);
Thomas W. Stone, Hellertown, PA (US)

(73) Assignee: Wavefront Research, Inc., Bethlehem, PA (US)

( * ) Notice: Subject to any disclaimer, the term of this patent is extended or adjusted under 35 U.S.C. 154(b) by 403 days.

(21) Appl. No.: 12/455,367

(22) Filed: Jun. 1, 2009

Related U.S. Application Data

(60) Provisional application No. 61/057,587, filed on May 30, 2008.

(51) Int. Cl.
*H01L 23/02* (2006.01)
(52) U.S. Cl. .................. 257/686; 257/E23.01
(58) Field of Classification Search ............ 257/686, 257/777–778, E23.01, E23.172
See application file for complete search history.

(56) References Cited

U.S. PATENT DOCUMENTS

| 5,216,278 | A | 6/1993 | Lin et al. |
| 7,902,652 | B2 * | 3/2011 | Seo et al. ............ 257/686 |
| 2008/0290491 | A1 * | 11/2008 | Yamano et al. ........ 257/686 |

FOREIGN PATENT DOCUMENTS

| EP | 2135839 A2 | 12/2009 |
| JP | 63081988 A2 | 4/1988 |

OTHER PUBLICATIONS

Chowdhury, S.; Ahmadi, M.; Miller, W.C.; Microelectromechanical systems and system-on-chip connectivity, IEEE Circuits and Systems Magazine, vol. 2 , Issue: 2 (2002) pp. 4-28.

* cited by examiner

*Primary Examiner* — Hoa B Trinh
(74) *Attorney, Agent, or Firm* — Burns & Levinson LLP; Jacob N. Erlich; Orlando Lopez

(57) ABSTRACT

Carriers enabling multichip driving of optoelectronic interconnects are disclosed. In one instance, the carriers provide a substantially perpendicular interface between the host circuit board and the optoelectronic die.

27 Claims, 7 Drawing Sheets

OPTOELECTRONIC CHIP CARRIERS

CROSS REFERENCE TO RELATED APPLICATIONS

This application claims priority to U.S. Provisional Application Ser. No. 61/057,587, filed May 30, 2008, entitled OPTOELECTRONIC CHIP CARRIERS, which is incorporated herein by reference in its entirety.

STATEMENT OF FEDERALLY SPONSORED RESEARCH OR DEVELOPMENT

This invention was made with U.S. Government support from the U.S. Air Force under contract #F30602-03-C-0213 and from the U.S. Air Force under contract #FA8750-04-C-0250. The U.S. Government has certain rights in the invention.

BACKGROUND

These teachings relate generally to integrated circuit die carriers.

SUMMARY

These teachings relate to, in one embodiment, carriers enabling multichip driving of optoelectronic interconnects and carriers providing a right angle interface between the host circuit board and the optoelectronic die.

The optoelectronic chip carriers of the present teachings, in one embodiment, provide a means for building compact optoelectronic and optical interconnect modules. The embodiments of the optoelectronic chip carriers of the present teachings also provide an efficient means for incorporating optoelectronic die disposed at a right angle to the host circuit board. The carriers of these teachings are vehicles for the mounting of optoelectronic chip components onto printed circuit boards for interface into applications.

The optoelectronic chip carriers of the present teachings allow the packaging and interconnection of opto-electronic elements in die form and an optional associated proximity circuit device chip to a primary wiring substrate, and, more particularly to facilitate mounting of a large planar array of top or bottom emitting/detecting opto-electronic elements, such as VCSELS and photo-detectors, on a surface that is perpendicular to the primary wiring substrate surface, that in some cases provides an optical axis plane that is parallel to the primary wiring substrate on which it is mounted. This right angle carrier allows for the optoelectronic die surface to be substantially perpendicular to the circuit board or substrate on which the carrier is mounted.

For a better understanding of the present teachings, together with other and further objects thereof, reference is made to the accompanying drawings and detailed description.

DETAILED DESCRIPTION OF THE PREFERRED EMBODIMENTS

Traditional carriers used for I/O interface of semiconductor devices to primary wiring substrates allow for mounting of the semiconductor die to a carrier, mount or sub-mount (sub-mount, mount, and carrier are used synonymously throughout this discussion) surface that is parallel to the circuit board or primary wiring substrate surface on which the carrier is mounted. Typical industry standard carriers provide for an electrical interconnect interface between die I/O pads and sub-mount carrier external conductor areas such as pins, solder balls, etc., and are typically made of plastic or ceramic type materials in I/O form factor styles such as DIP, Quad-packs, LCC (Leadless chip carrier), ball-grid arrays, SOIC, etc. Consequently, when a top or bottom emitting/detecting array of opto-electronic devices semiconductor die is mounted in this fashion the optical axis is perpendicular to the primary wiring substrate to which the sub-carrier is attached.

Figure 1:
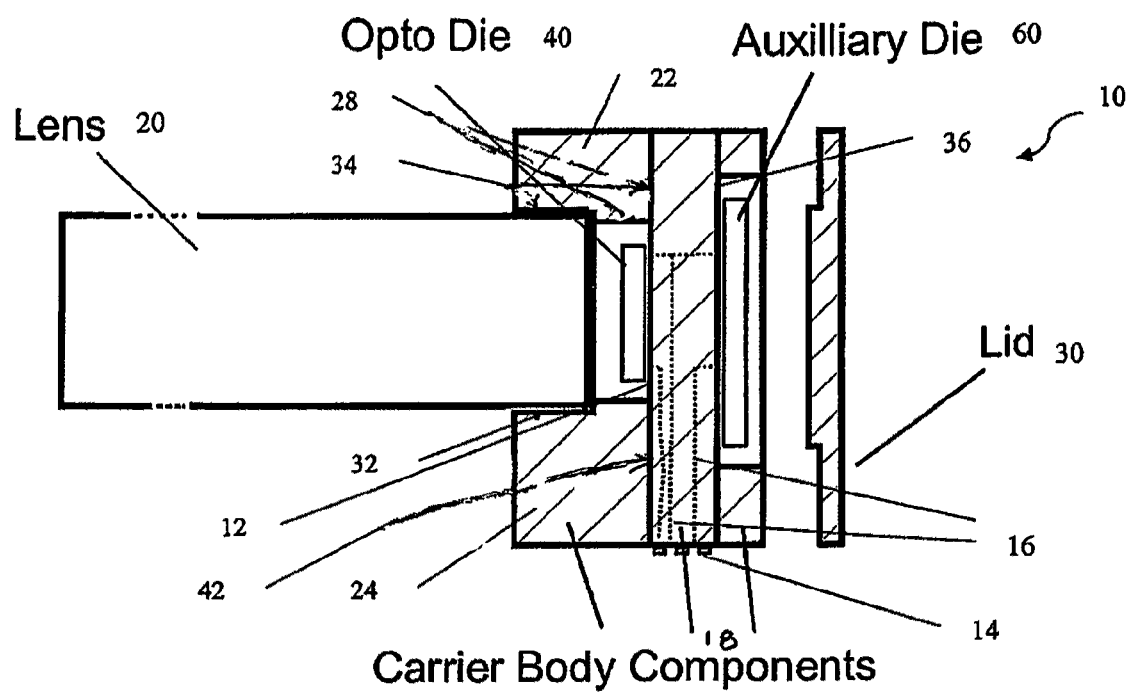
FIG. 1 is a schematic of a right-angled embodiment of the system of these teachings.

The right-angle embodiment 10 of the optoelectronic chip carrier, an example of which is shown in FIG. 1, is a receptacle type optical module that acts as a carrier providing a die mounting surface 12 that is perpendicular to the package's external mounting surface 14 which typically contains components for external connection 18, such as, but not limited to, solder bumps, pins, etc. This carrier provides for a direct, on axis, optical interface of a top or bottom emitting/detecting opto-electronic device array die with ancillary optical components or systems (such as a cylindrical rod lens 20) whose axis or orientation is parallel to the circuit board or primary wiring substrate surface. The carrier comprises mounting surfaces 12 and optionally 36 for die and an associated plurality of conductor contact pads (72, FIG. 2) allowing for interconnection of device die I/O pads and package interior connections via 3D conductive circuit paths 16 through the carrier wall thicknesses (or, alternatively, along carrier walls and surfaces) which allow for signals in and out of the carrier module terminating in components for external connection 18, such as, but not limited to, ball-grid array for solder bumping, through-hole pins, J-leads, etc. These conductive signal paths 16 can be designed for a controlled impedance function and interconnect the optoelectronic die 40, optional auxiliary die 60, and the external connection components 18.

The optoelectronic chip carrier 10 of the present teachings is shown in FIG. 1 together with an optical component 20, an infinite conjugate imager (lens) in the embodiment shown in FIG. 1, to form an Optical Data Pipe module. It should be noted that a variety of other optical components, such as, but not limited to, prisms and mirrors, are also within the scope of these teachings. However the optoelectronic chip carrier 10 can be used without a lens or ancillary optical system in other applications. In one embodiment, the optoelectronic chip carrier 10 contains two compartments with mounting surfaces 12 and 36, respectively. In other embodiments, the carrier 10 only contains one or three or more compartments with respective die mounting surfaces.

In the two-compartment embodiment 10 in FIG. 1, one compartment is utilized for the opto-electronic device array die 40, connected via conductors through the intervening wall thickness to an adjunct active circuit substrate 60 mounted in the second compartment. Conductor paths to/from the adjunct circuit substrate 60 and the package exterior are provided by using such technologies (but not limited to) as co-fired ceramic, thin-film or thick-film techniques. For example, these techniques are used in the fabrication of commercial ceramic pin-grid array packages and in the fabrication of ball grid array packages.

If required, these compartments can be designed and manufactured to provide hermeticity. In one such example, the lens 20 may be soldered into the optional carrier socket wall 32 formed by carrier features 22 and 24. Accordingly the optical component aperture fixture formed by optional structures 22 and 24, a lens aperture fixture in the embodiment shown, allows for optical components such as the cylindrical lens in the embodiment shown, with a designed-for-fit dimension and may, as an option, have a keying element for optical component (lens) orientation. Other optional features such as the recessed surface 28 can be used to form an insertion stop for the optical component 20, such as establishing assembly to a predetermined back focal distance between a lens 20 and optoelectronic die 40. The optical component, a lens rod in the embodiment shown, can be secured by a type of epoxy technology or a mechanical compression coupling, or can be soldered in place, or fixed by a number of other standard techniques in the packaging art.

Die I/O electrical connectivity can be affected by conductive epoxy, solder-ball or wirebond techniques. The optoelectronic element/lens interface region between optical component 20 and optoelectronic die 40 may contain a volume fill or potting material for control of environment, thermal, or optical coupling issues if desired.

Referring to FIG. 1, the carrier body components 80 include an upper body component 22 and a lower body component 24. The upper body component 22 as a first surface 28. and a second surface 34. The lower body component 24 has a first surface 32 and a second surface 42. The second surface 34 of the upper body component 22 and the second surface 42 of the lower body component 24 are disposed on and operatively attached to the die mounting surface 12.

In the embodiment shown in FIG. 1, the optoelectronic chip carrier 10 has a second compartment, the second compartment having another die mounting surface 36 on which an electronic component die 60 is mounted on. The second die mounting surface 36 has a number of conductor contact locations disposed on the surface (mirror image of 72, FIG. 2)

A lid 30 can be designed for the adjunct circuit substrate compartment that will provide for a physical contact, and consequently, a good thermal path from the surface of the circuit substrate to the exterior of the package. Alternatively this lid can be used to hermetically seal the optional adjunct circuit substrate compartment. This compartment can also be filled with a volume fill material as well.

Figure 2:
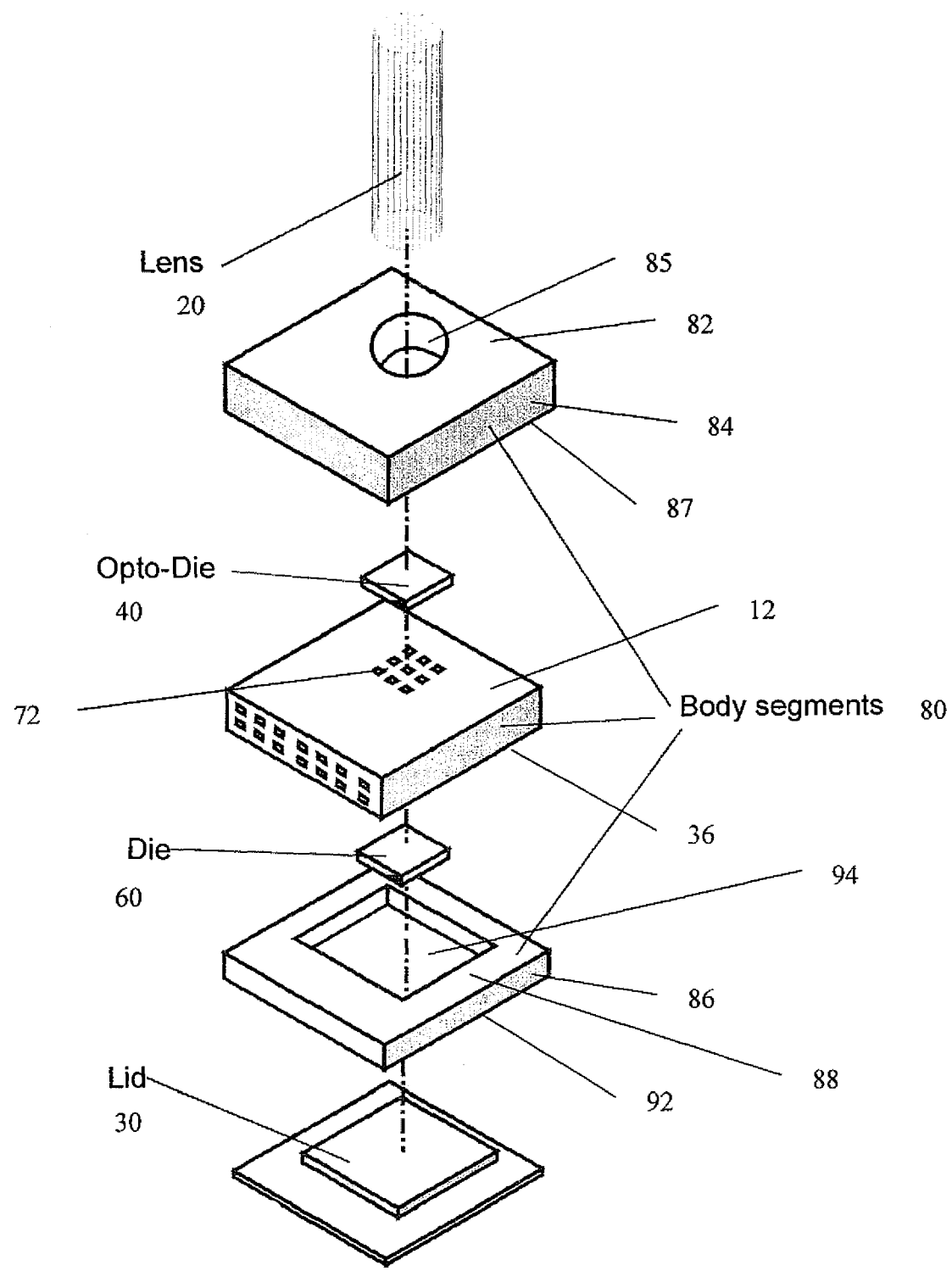
FIG. 2 is an expanded view of an embodiment of the system of these teachings.

One embodiment of the system of these teachings illustrating an embodiment of the method for assembling the optoelectronic chip carrier 10 is shown in FIG. 2.

In the embodiment shown in FIG. 2, the carrier body components 80 include an optional upper body component 84 and an optional lower body component 86. The upper body component 84 has a first upper body component surface 82, a second upper body component surface 87 and an opening 85 through the upper body component, the opening 85 extending from the first upper body component surface 82 to the second upper body component surface 87. The dimensions of the opening are selected such that an optical or other ancillary component can be mounted into the opening. In one embodiment, the opening surrounds and is disposed away from the optoelectronic component 40. The lower body component 86 has a first lower body component surface 88, a second lower body component surface 92 and an opening 94 through the lower body component, the opening 94 extending from the first lower body component surface 88 to the second lower body component surface 92. The opening 94 surrounds and is disposed away from the electronic component 60.

The three main structural body segments 80 can be setup relative to one another with solders and/or epoxies. Components can be assembled in a step-wise fashion by selecting differing cure or melt point solders/epoxies. Other manufacturing procedures can be used such as molding, fusing, or co-firing the structure at once (where the carrier and the other body components are assembled as an integral device) or in stages.

In the two-compartment right-angle optoelectronic chip carrier embodiments of the present teachings shown in FIGS. 1 and 2, an optoelectronic die 40 is shown in one compartment together with an auxiliary die 60 in a second compartment. This auxiliary die in any of the embodiments of the present invention can also be optoelectronic die, and in the optoelectronic chip carrier embodiments shown in FIGS. 1 and 2, the lid structure over the auxiliary die compartment can be replaced in a straightforward manner with the optional optical ancillary system or optical component mounting features as described surrounding the optoelectronic die 40—so that lenses or other optical components or ancillary optical systems can be mounted or interfaced over any optoelectronic die in any of the optoelectronic die carrier compartments.

Figure 3:
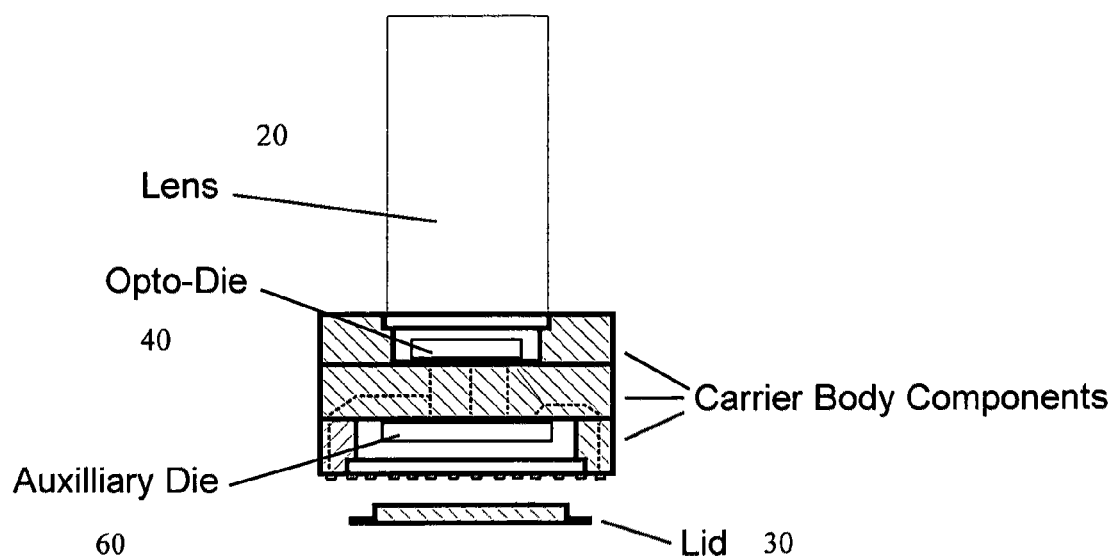
FIG. 3 is a schematic of another embodiment of the system of these teachings.

Another embodiment of optoelectronic chip carrier 10 is shown in FIG. 3. The general principles stated above are applicable. In this embodiment, however, the optical axis is maintained on a plane perpendicular to the mounting substrate. The embodiment shown in FIG. 3 is similar to that of FIGS. 1 and 2. However, in the embodiment shown in FIG. 3, the conductive signal paths 102 connect the first die mounting surface 12, the second die mounting surface 36 and the second lower body component surface 92. A number of components for external connection 104 are disposed on the second lower body component surface 92. These components for external connection can include solder bumps, pins, etc. as described above, and can be located along the periphery of the carrier surface 92. In this case, the lid 30 may be used as before to provide protection, cooling, or hermeticity. In another configuration, the lid may contain further interconnects allowing for the components for external connection 104 to optionally be additionally arrayed across the entire surface 92 as shown in FIG. 3.

In the two compartment optoelectronic chip carrier shown in FIG. 3, the top compartment with die mounting surface 12 is shown interfacing to an ancillary optical system or optical component rod lens 20 as in the carrier embodiments of FIGS. 1 and 2, and the lower compartment is shown with an auxiliary die. This auxiliary die in any of the embodiments of the present invention can also be an optoelectronic die, and in the embodiment shown in FIG. 3, the components for electrical connection 104 can be restricted to the periphery of the mounting surface 92 and the optional lid can be omitted or made transparent so that the optoelectronic die mounted on surface 36 can optically couple to or through the circuit board or primary wiring substrate surface on which the optoelectronic chip carrier is mounted. This latter configuration of the embodiment shown in FIG. 3 is useful, for example, for coupling optically into waveguide embedded or integrated in the circuit board or primary wiring substrate surface on which the optoelectronic chip carrier is mounted.

The right angle optoelectronic chip carrier shown in FIGS. 1 and 2 can also be fabricated according to the present teachings to provide for other angles, substantially inclined but at other than right angles between the die mounting surface 12 (and optionally 36) and the board mounting surface 14. For example, the die mounting surface may subtend 45 degrees with respect to the board mounting surface, allowing for the optical axis of an included lens or ancillary optical system to travel away from the board or primary wiring surface at an oblique angle. For the purposes of these teachings, substantially perpendicular include optoelectronic chip carrier in which the die mounting surface 12 is inclined with respect to the board mounting surface 14 at angles other than right angle. Inclined as used herein does not include embodiments in which the die mounting surface 12 is substantially parallel to the board mounting surface 14

In the embodiment of the optoelectronic chip carrier shown in FIG. 3, two compartments with mounting surfaces 12 and 36, respectively are shown. In embodiments such as that shown in FIG. 3, carrier embodiments are included in which the carrier 10 only contains one or three or more compartments with respective die mounting surfaces.

Packaging devices, such as the embodiments disclosed hereinabove, are used for optoelectronic devices such as the Optical Data Pipe technology because non-conventional packaging is needed to deliver the tiny footprint potential of such technologies. The optical data pipe technology is described in detail in U.S. Pat. No. 7,015,454, w and related cases.

Figure 4:
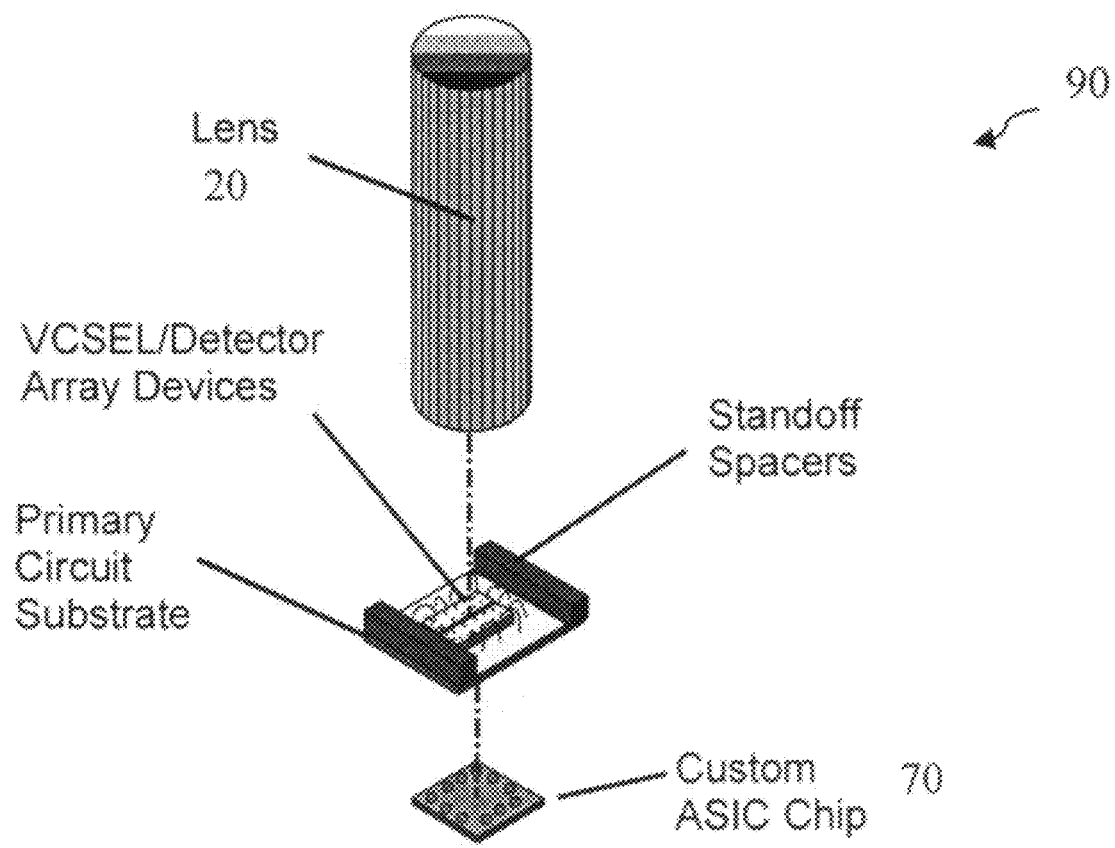
FIG. 4 is an expanded view of the packaging technology of an embodiment of the system of these teachings.

Another embodiment of the packaging technology of the present teachings is illustrated in FIG. 4. For this Optical Data Pipe (ODP) or Advanced Optical Feed-Thru (AOFT) package 90, an ASIC 70 is used to drive a plurality, e.g. 25,50,100, or 200 channels. The infinite conjugate imager lens 20 can be actively aligned, or it may be assembled resting on the optional standoff spacers shown in FIG. 4 and then fixed, cemented, or potted using epoxies, mechanical, or other fixturing techniques. The second generation ODP/AOFT package includes a high performance assembly incorporating a monolithic die which may contain both emitters such as VCSELs, and detectors such as PIN photodiode devices.

Figure 5:
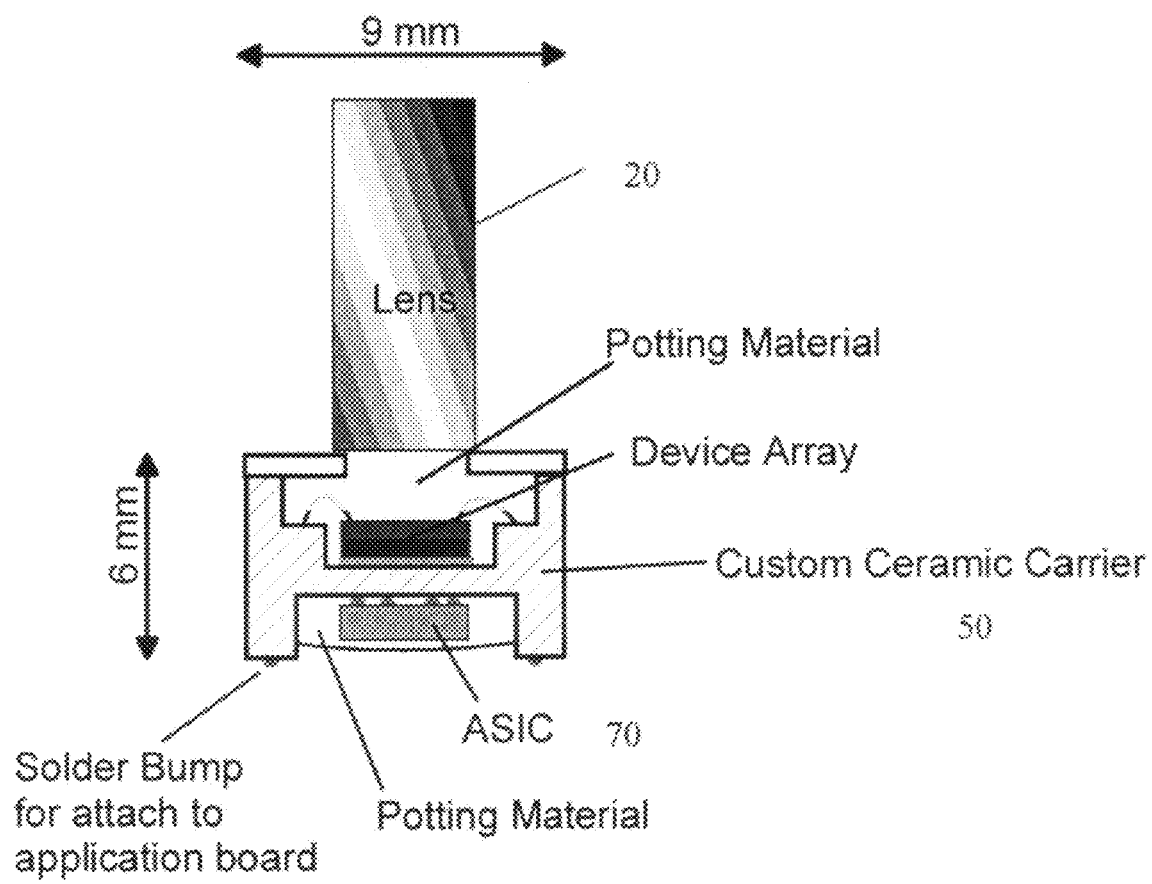
FIG. 5 is a schematic of a packaging assembly of an embodiment of the system of these teachings.

In one instance, ASIC drivers and optoelectronic die are expected to collapse the area of a plurality of interconnected channels to 6-16 mm2 in an Optical Data Pipe application, and incorporating solder-bumped custom ASIC electronics in the packaging devices keeps the footprint small. One embodiment of a packaging configuration assembly of these teachings is illustrated in FIG. 5. Here a custom ceramic carrier 50 of the present teachings is used and the compact module is solder-bumped to the circuit or sensor board. Here the lens 20 is aligned and fixed relative to the optoelectronic device array 40 and ASIC support electronics 70.

Figure 6:
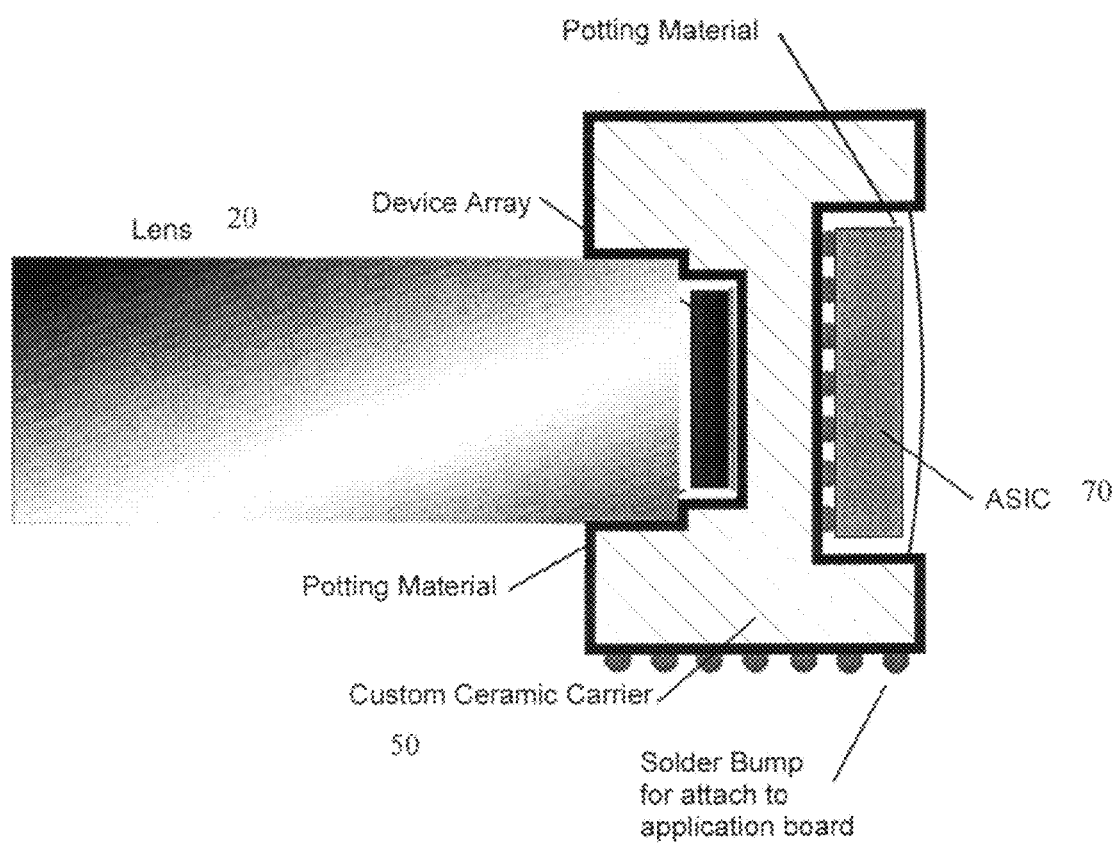
FIG. 6 is a schematic of a right-angled packaging assembly of an embodiment of the system of these teachings.

For some board-to-board Optical Data Pipe (BB-ODP) applications, it is helpful to interconnect parallel to the circuit board surface rather than perpendicular to it, as described hereinabove. For these applications, a right-angle ceramic carrier 50 illustrated in FIG. 6 can be enabling. One embodiment is illustrated in FIG. 6, where one-half of an OPD module pair is shown. The solder bumped carrier maintains a very small footprint, ideally on the order of the footprint of the lens cross-section alone.

One component of an optical data pipe module is the optoelectronic chip carrier 10 of the present teachings shown in FIG. 6. In practice this optical data pipe module could face another in-line (e.g., for board-to-backplane applications) or right angle (for board-to-board applications) optical data pipe module to interconnect a number of data channels.

Figure 7:
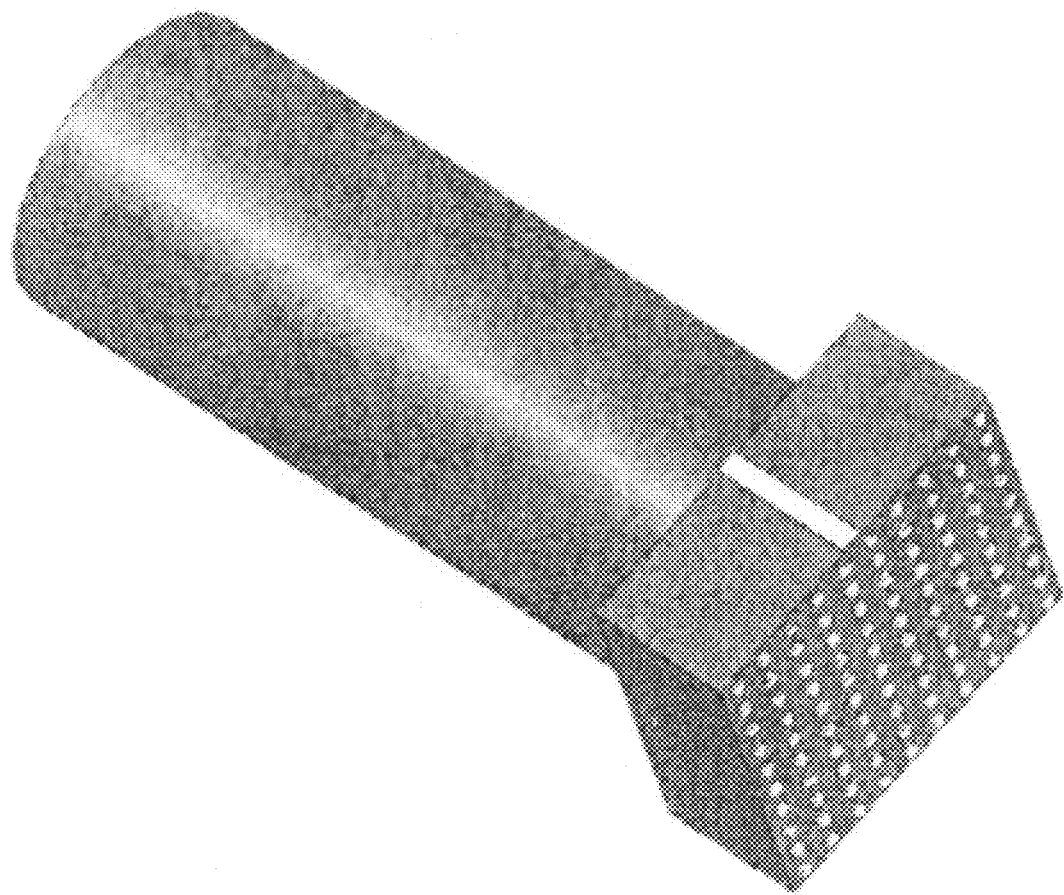
FIG. 7 is a three-dimensional view of a packaging assembly of another embodiment of the system of these teachings.

Another embodiment of an optoelectronic carrier of the present teachings utilizing high density ball grid array packaging techniques is illustrated in FIG. 7. The long cylindrical extension protruding from the carrier houses the infinite conjugate imager of the optical data pipe technology and the solder bump module packaging is shown on the module bottom.

Although the teachings have been described with respect to various embodiments, it should be realized that these teachings are also capable of a wide variety of further and other embodiments within the spirit and scope of the teachings.

What is claimed is:

1. A device comprising:
  a carrier component comprising:
    a first plurality of conductor contacts disposed on a first die mounting surface being part of said carrier component;
    a plurality of components for external connection disposed on a package mounting surface being part of said carrier component;
    said package mounting surface being substantially inclined with respect to said first die mounting surface;
    a plurality of conductive circuit paths operatively connecting at least some of said conductor contacts with at least some of said plurality of components for external connection; and
    said plurality of conductive circuit paths allowing electrical connection between at least some of said first plurality of conductor contacts and at least some of said plurality of components for external connection.

2. The device of claim 1 wherein said carrier component further comprises:
  a second plurality of conductor contacts disposed on a second die mounting surface being part of said carrier component, said second die mounting surface being substantially opposite said first die mounting surface; and
  wherein said plurality of conductive circuits paths are disposed between said first die mounting surface, said second die mounting surface and said package mounting surface; and
  said plurality of conductive circuit paths allow electrical connection between said first plurality of conductor contacts, said second plurality of conductor contacts and said plurality of components for external connection; said package mounting surface being also substantially perpendicular to said second die mounting surface.

3. The device of claim 1 wherein said carrier component further comprises:
  an upper body component comprising:
    a first upper body component surface substantially perpendicular to said first die mounting surface; said first upper body component surface disposed above an optoelectronic component; said optoelectronic component mounted on said first die mounting surface; and
    a second upper body component surface substantially perpendicular to said first upper body component surfaces;
    said second upper body component surface being disposed on and operatively attached to said first die mounting surface at a location above a location where said optoelectronic component is mounted; and
  a lower body component comprising:
    a first lower body component surface substantially perpendicular to said first die mounting surface; said first lower body component surface disposed below said optoelectronic component; and a second lower body component surface substantially perpendicular to said first lower body component surface;

said second lower body component surface being disposed on and operatively attached to said first die mounting surface at a location below a location where said optoelectronic component is mounted.

4. The device of claim 3 wherein said first upper body component surface has an indented portion; said indented portion extending from a location between said second upper body component surface and an external surface of said upper body component to a location of said upper body component external surface; and said first lower body component surface has an indented portion; said indented portion extending from a location between said second lower body component surface and an external surface of said lower body component to a location of said upper body component extern& surface;

said indented portion of said first upper body component surface and said indented portion of said first lower body component surface provide a mounting location for an optical component.

5. A device comprising:
a carrier component comprising:
   a first die mounting surface;
   a first plurality of conductor contact locations disposed on said first die mounting surface;
   a package mounting surface substantially perpendicular to said first die mounting surface;
   a plurality of components for external connection disposed on said package mounting surface; and
   a plurality of conductive circuits paths operatively connecting said first die mounting surface and said package mounting surface;
   said plurality of conductive circuit paths allowing electrical connection between said first plurality of conductor contact locations and said plurality of components for external connection;
wherein said carrier component further comprises:
   a second die mounting surface substantially opposite said first die mounting surface;
   a second plurality of conductor contact locations disposed on said second die mounting surface; and
   wherein said plurality of conductive circuits paths are disposed between said first die mounting surface, said second die mounting surface and said package mounting surface; and
said plurality of conductive circuit paths allow electrical connection between said first plurality of conductor contact locations, said second plurality of conductor contact locations and said plurality of components for external connection; said package mounting surface being also substantially perpendicular to said second die mounting surface; and
wherein said carrier component even further comprises:
a back body component comprising:
   a first back body component surface opposite said second die mounting surface;
   a second back body component surface opposite said second die mounting surface and opposite said first back body component surface; said second back body component surface disposed over and operatively attached to a portion of said second die mounting surface; and
   an opening through said back body component extending from said first back body component surface to said second back body component surface; said opening surrounding and disposed away from an electronic component, the electronic component being disposed on said second die mounting surface, 6. The device of claim 5 wherein said carrier component further comprises:
   a lid component disposed over said back body component.

7. The device of claim 6 wherein a portion of said lid component is disposed in said opening.

8. The device of claim 6 wherein a material of said lid component and a material of said back body component are selected to provide a thermal path from said second die mounting surface to an exterior of said lid component.

9. A device comprising:
a carrier component comprising;
   a first die mounting surface;
   a first plurality of conductor contact locations disposed on said first die mounting surface;
   a package mounting surface substantially perpendicular to said first die mounting surface;
   a plurality of components for external connection disposed on said package mounting surface; and
   a plurality of conductive circuits paths operatively connecting said first die mounting surface and said package mounting surface;
   said plurality of conductive circuit paths allowing electrical connection between said first plurality of conductor contact locations and said plurality of components for external connection;
wherein said carrier component further comprises:
a front body component comprising:
   a first front body component surface opposite said first die mounting surface;
   a second front body component surface opposite said first die mounting surface and opposite said first front body component surface; said second front body component surface disposed on and operatively attached to a portion of said first die mounting surface; and
   an opening through said front body component extending from said first front body component surface to said second front body component surface; said opening surrounding and disposed away from an optoelectronic component; said optoelectronic component mounted on said first die mounting surface.

10. The device of claim 9 wherein dimensions of said opening being selected such that an optical component can be mounted into said opening.

11. The device of claim 10 wherein said optical component is a rod lens.

12. A device comprising:
an optoelectronic component;
and electronic components;
a carrier component comprising:
   a first die mounting surface;
   a first plurality of conductor contact locations disposed on said first die mounting surface;
   said optoelectronic component mounted on said first die mounting surface; said optoelectronic component being electrically attached to at least some of said first plurality of conductor contact locations;
   a second die mounting surface substantially opposite said first die mounting surface;
   a second plurality of conductor contact locations disposed on said second die mounting surface;
   said electronic component being mounted on said second die mounting surface;

said electronic component being electrically connected to at least some conductor contact locations from said second plurality of conductor contact locations;

a lower body component disposed on and operatively attached to a portion of said second die mounting surface; said lower body component surrounding at least a portion of said electronic component; said lower body component comprising:

a first lower body component surface disposed on said portion of said second die mounting surface;

a second lower body component surface opposite said first lower body component surface; and a plurality of components for external connection disposed on said second lower body component surface; and a plurality of conductive circuits paths disposed between said first die mounting surface, said second die mounting surface and said second lower body component surface;

an optical component;

an upper body component disposed on and operatively attached to a portion of said first die mounting surface; said upper body component surrounding at least a portion of said optoelectronic component and providing an opening extending from said optoelectronic component to an exterior of the device; said upper body component and said opening being dimensioned such that said optical component can be mounted to said upper body component; said optical component being operatively attached to said upper body component.

13. The device of claim 12 wherein said upper body component comprises:

a first upper body component surface opposite said first die mounting surface;

a second upper body component surface opposite said first die mounting surface and opposite said first upper body component surface; said second upper body component surface disposed on and operatively attached to a portion of said first die mounting surface; and an opening through said upper body component extending from said first upper body component surface to said second upper body component surface; said opening surrounding and disposed away from said optoelectronic component;

dimensions of said opening being selected such that an optical component can be mounted into said opening.

14. The device of claim 13 wherein said optical component is a rod lens.

15. The device of claim 12 wherein said upper body component comprises:

a first upper body sub-component comprising:

a first upper body sub-component first surface substantially perpendicular to said first die mounting surface; said first upper body sub-component first surface disposed in proximity to said optoelectronic component; and a first upper body sub-component second surface substantially perpendicular to said first upper body sub-component first surface;

said first upper body sub-component second surface being disposed on and operatively attached to said first die mounting surface at a location in proximity to a location where said optoelectronic component is mounted; and a second body sub-component disposed opposite said first body subcomponent and comprising:

a second body sub-component first surface substantially perpendicular to said first die mounting surface; said second body sub-component first surface disposed in proximity to said optoelectronic component; and a second body sub-component second surface substantially perpendicular to said second body sub-component first surface;

said second body sub-component second surface being disposed on and operatively attached to said first die mounting surface at a location in proximity to a location where said optoelectronic component is mounted;

said first body sub-component first surface having an indented portion; said indented portion extending from a location between said first body sub-component second surface and an external surface of said first body sub-component to a location of said first body sub-component external surface; and said second body sub-component first surface having an indented portion; said indented portion extending from a location between said second body sub-component second surface and an external surface of said second body sub-component to a location of said second body sub-component external surface;

said indented portion of said first body sub-component first surface and said indented portion of said second body sub-component first surface providing a mounting location for an optical component.

16. A device comprising:

a carrier component comprising:

a first plurality of conductor contacts disposed on a first die mounting surface being part of said carrier component;

a plurality of components for external connection disposed on a package mounting surface being part of said carrier component;

said package mounting surface being substantially inclined with respect to said first die mounting surface;

a plurality of conductive circuit paths operatively connecting at least some of said conducting contacts with at least some of said plurality of components for external connection; and said plurality of conductive circuit paths allowing electrical connection between at least some of said first plurality of conductor contacts and at least some of said plurality of components for external connection; and an optoelectronic die mounted on said first die mounting surface; said optoelectronic die being electrically attached to at least some of said first plurality of conductor contacts.

17. The device of claim 16 wherein said carrier component further comprises:

a second plurality of conductor contacts disposed on a second die mounting surface being part of said carrier component, said second die mounting surface being substantially opposite said first die mounting surface;

wherein said plurality of conductive circuits paths are operatively connecting said first die mounting surface, said second die mounting surface and said package mounting surface; and said plurality of conductive circuit paths allow electrical connection between said first plurality of conductor contacts, said second plurality of conductor contacts and said plurality of components for external connection;

the device also comprising an optoelectronic die mounted on said second die mounting surface; said optoelectronic die being electrically connected to at least some conductor contacts from said second plurality of conductor contacts.

18. The device of claim 16 wherein said carrier component further comprises:
an upper body component comprising:
a first upper body component surface substantially perpendicular to said first die mounting surface; said first upper body component surface disposed above said optoelectronic die; and
a second upper body component surface substantially perpendicular to said first upper body component surfaces;
said second upper body component surface being disposed on and operatively attached to said first die mounting surface at a location above a location where said optoelectronic die is mounted; and
a lower body component comprising:
a first lower body component surface substantially perpendicular to said first die mounting surface; said first lower body component surface disposed below said optoelectronic die; and
a second lower body component surface substantially perpendicular to said first lower body component surface;
said second lower body component surface being disposed on and operatively attached to said first die mounting surface at a location below a location where said optoelectronic die is mounted.

19. A device comprising:
a carrier component comprising:
a first die mounting surface;
a first plurality of conductor contact locations disposed on said first die mounting surface;
a package mounting surface substantially perpendicular to said first die mounting surface;
a plurality of components for external connection disposed on said package mounting surface;
a plurality of conductive circuits paths operatively connecting said first die mounting surface and said package mounting surface;
said plurality of conductive circuit paths allowing electrical connection between said first plurality of conductor contact locations and said plurality of components for external connection; and
an optoelectronic component mounted on said first die mounting surface; said optoelectronic component being electrically attached to at least some of said first plurality of conductor contact locations;
wherein said carrier component further comprises:
an upper body component comprising:
a first upper body component surface substantially perpendicular to said first die mounting surface; said first upper body component surface disposed above said optoelectronic component; and
a second upper body component surface substantially perpendicular to said first upper body component surfaces;
said second upper body component surface being disposed on and operatively attached to said first die mounting surface at a location above a location where said optoelectronic component is mounted; and
a lower body component comprising:
a first lower body component surface substantially perpendicular to said first die mounting surface;
said first lower body component surface disposed below said optoelectronic component; and
a second lower body component surface substantially perpendicular to said first lower body component surface;
said second lower body component surface being disposed on and operatively attached to said first die mounting surface at a location below a location where said optoelectronic component is mounted;
wherein said first upper body component surface has an indented portion; said indented portion extending from a location between said second upper body component surface and an external surface of said upper body component to a location of said upper body component external surface; and
said first lower body component surface has an indented portion; said indented portion extending from a location between said second lower body component surface and an external surface of said lower body component to a location of said upper body component external surface;
said indented portion of said first upper body component surface and said indented portion of said first lower body component surface provide a mounting location for an optical component.

20. A device comprising:
a carrier component comprising:
a first die mounting surface;
a first plurality of conductor contact locations disposed on said first die mounting surface;
a package mounting surface substantially perpendicular to said first die mounting surface;
a plurality of components for external connection disposed on said package mounting surface;
a plurality of conductive circuits paths operatively connecting said first die mounting surface and said package mounting surface;
said plurality of conductive circuit paths allowing electrical connection between said first plurality of conductor contact locations and said plurality of components for external connection; and
an optoelectronic component mounted on said first die mounting surface; said optoelectronic component being electrically attached to at least some of said first plurality of conductor contact locations;
wherein said carrier component further comprises:
a second die mounting surface substantially opposite said first die mounting surface;
a second plurality of conductor contact locations disposed on said second die mounting surface;
and wherein said plurality of conductive circuits paths are operatively connecting said first die mounting surface, said second die mounting surface and said package mounting surface;
and said plurality of conductive circuit paths allow electrical connection between said first plurality of conductor contact locations, said second plurality of conductor contact locations and said plurality of components for external connection;
the device also comprising an electronic component mounted on said second die mounting surface said electronic component being electrically connected to at least some conductor contact locations from said second plurality of conductor contact locations;
wherein said carrier component even further comprises:
a back body component comprising:
a first back body component surface opposite said second die mounting surface;

a second back body component surface opposite said second die mounting surface and opposite said first back body component surface; said second back body component surface disposed over and operatively attached to a portion of said second die mounting surface; and an opening through said back body component extending from said first back body component surface to said second back body component surface; said opening surrounding and disposed away from said electronic component.

21. The device of claim 20 wherein said carrier component further comprises:

a lid component disposed over said back body component.

22. The device of claim 21 wherein a portion of said lid component is disposed in said opening.

23. The device of claim 21 wherein a material of said lid component and a material of said back body component are selected to provide a thermal path from said second die mounting surface to an exterior of said lid component 24. A device comprising:

a carrier component comprising:

a first die mounting surface;

a first plurality of conductor contact locations disposed on said first die mounting surface;

a package mounting surface substantially perpendicular to said first die mounting surface;

a plurality of components for external connection disposed on said package mounting surface;

a plurality of conductive circuits paths operatively connecting said first die mounting surface and said package mounting surface;

said plurality of conductive circuit paths allowing electrical connection between said first plurality of conductor contact locations and said plurality of components for external connection; and an optoelectronic component mounted on said first die mounting surface; said optoelectronic component being electrically attached to at least some of said first plurality of conductor contact locations;

wherein said carrier component further comprises:

a front body component comprising:

a first front body component surface opposite said first die mounting surface;

a second front body component surface opposite said first die mounting surface and opposite said first front body component surface; said second front body component surface disposed on and operatively attached to a portion of said first die mounting surface; and an opening through said front body component extending from said first front body component surface to said second front body component surface; said opening surrounding and disposed away from said optoelectronic component;

dimensions of said opening being selected such that an optical component can be mounted into said opening.

25. The device of claim 24 wherein said optical component is a rod lens.

26. The device of claim 1 wherein said package mounting surface is substantially perpendicular with respect to said first die mounting surface.

27. The device of claim 16 wherein said package mounting surface is substantially perpendicular with respect to said first die mounting surface.

* * * * *

UNITED STATES PATENT AND TRADEMARK OFFICE
CERTIFICATE OF CORRECTION

| | |
|---|---|
| PATENT NO. | : 8,378,475 B1 |
| APPLICATION NO. | : 12/455367 |
| DATED | : February 19, 2013 |
| INVENTOR(S) | : Randall C. Veitch et al. |

It is certified that error appears in the above-identified patent and that said Letters Patent is hereby corrected as shown below:

In the Claims:

In Column 7, line 18 (claim 4), "extern&" should read -- external --

Signed and Sealed this
Sixteenth Day of April, 2013

Teresa Stanek Rea
*Acting Director of the United States Patent and Trademark Office*